United States Patent
Chiang et al.

(10) Patent No.: US 8,778,801 B2
(45) Date of Patent: Jul. 15, 2014

(54) METHOD FOR FORMING SEED LAYER STRUCTURE

(71) Applicant: Taiwan Semiconductor Manufacturing Company, Ltd., Hsin-Chu (TW)

(72) Inventors: Chen-Bin Chiang, Hsin-Chu (TW); Hung-Chih Wang, Hsin-Chu (TW); Kuei-Pin Lee, New Taipei (TW); Chi-Yu Chou, Zhubei (TW); Yao Hsiang Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/624,664

(22) Filed: Sep. 21, 2012

(65) Prior Publication Data

US 2014/0084470 A1    Mar. 27, 2014

(51) Int. Cl.
    *H01L 21/44*    (2006.01)
(52) U.S. Cl.
    USPC ........... 438/687; 438/679; 438/695; 438/696; 438/707; 438/713; 257/E21.584; 257/E21.586; 257/E21.575

(58) Field of Classification Search
    None
    See application file for complete search history.

(56) References Cited

U.S. PATENT DOCUMENTS

| | | | |
|---|---|---|---|
| 6,117,781 A * | 9/2000 | Lukanc et al. | 438/692 |
| 6,410,418 B1 * | 6/2002 | Yang | 438/626 |
| 7,648,899 B1 * | 1/2010 | Banerji et al. | 438/598 |
| 2006/0014374 A1 * | 1/2006 | Barth et al. | 438/622 |
| 2010/0068881 A1 * | 3/2010 | Kang et al. | 438/653 |
| 2011/0049705 A1 | 3/2011 | Liu et al. | |

* cited by examiner

*Primary Examiner* — Zandra Smith
*Assistant Examiner* — Khanh Duong
(74) *Attorney, Agent, or Firm* — Slater and Matsil, L.L.P.

(57) ABSTRACT

A seed layer comprises a bottom seed layer portion formed on the bottom of a via opening, a sidewall seed layer portion formed on an upper portion of the sidewall of the via opening and a corner seed layer portion formed between the bottom seed layer portion and the sidewall seed layer portion. The sidewall seed layer portion is of a first thickness. The corner seed layer portion is of a second thickness and the second thickness is greater than the first thickness.

13 Claims, 12 Drawing Sheets

METHOD FOR FORMING SEED LAYER STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

One such creative packaging technique is the fabrication of interconnect structures, e.g., vias and metal lines. A complementary metal oxide semiconductor (CMOS) device may include a variety of semiconductor structures such as transistors, capacitors, resistors and/or the like. One or more conductive layers comprising metal lines are formed over the semiconductor structures and separated by adjacent dielectric layers. Vias are formed in the dielectric layers to provide an electrical connection between adjacent metal lines. In sum, metal lines and vias interconnect the semiconductor structures and provide a conductive channel between the semiconductor structures and the external contacts of the CMOS device.

A metal line and its adjacent via may be formed by using a dual damascene process. According to the fabrication process of a dual damascene structure, a dual damascene opening comprising a via portion and a trench portion is formed within a dielectric layer. The dual damascene opening may be formed by photolithography techniques known in the art. Generally, photolithography involves depositing a photoresist material and then irradiating (exposing) and developing in accordance with a specified pattern to remove a portion of the photoresist material. The remaining photoresist material protects the underlying material from subsequent processing steps, such as etching. The etching process may be a wet or dry, anisotropic or isotropic, etch process, but preferably is an anisotropic dry etch process. After the etching process, the remaining photoresist material may be removed. It should also be noted that the damascene interconnect opening may be formed by one or more alternative process steps (e.g., a via first or a trench first damascene process).

After the dual damascene opening is formed, a barrier layer and a seed layer may be formed along the sidewalls and the bottom of the dual damascene opening. The barrier layer may be formed by suitable fabrication techniques such as various physical vapor deposition (PVD) techniques and the like. The seed layer may be formed by using suitable fabrication techniques such as PVD, electroless plating and the like.

Furthermore, an electroplating process may be applied to the dual damascene opening. As a result, the dual damascene opening is filled with a conductive material. The conductive material may comprise copper, although other suitable materials such as aluminum, alloys, tungsten, silver, doped polysilicon, combinations thereof, and/or the like, may alternatively be utilized.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, namely a seed layer structure and formation method of a semiconductor device. The embodiments of the disclosure may also be applied, however, to a variety of semiconductor devices. Hereinafter, various embodiments will be explained in detail with reference to the accompanying drawings.

Figure 1:
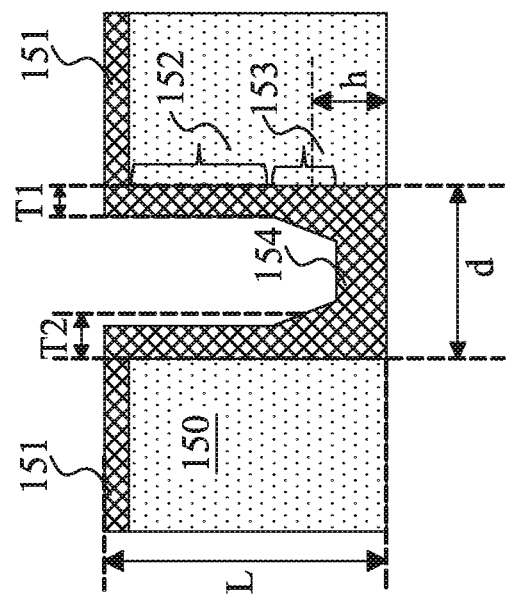
FIG. 1 illustrates a cross sectional view of a via opening having a seed layer formed over the sidewalls and bottom of the via opening in accordance with various embodiments.

FIG. 1 illustrates a cross sectional view of a via opening having a seed layer formed along the sidewalls and the bottom of the via opening in accordance with various embodiments. As shown in FIG. 1, there may be a seed layer formed conformally along the sidewalls of the via opening, the bottom of the via opening and the top surface of a dielectric layer 150. The seed layer may be formed of a conductive material such as copper and the like. The seed layer may be formed by using suitable fabrication techniques such as physical vapor deposition (PVD) and the like.

The seed layer may be divided into four portions according to different locations. A first portion 151 is formed directly over the dielectric layer 150. A second portion 152 is formed along the sidewall of the via opening and close to the upper portion of the sidewall. A third portion 153 is formed on the sidewall of the via opening and close to the bottom portion of the sidewall. A fourth portion 154 is formed on the bottom of the via opening.

As shown in FIG. 1, the depth of the via opening is defined as L. The width of the top opening of the via is defined as d. The aspect ratio of the via is defined as AR, which is equal to L/d. In accordance with various embodiments, the thickness of the seed layer, especially the thickness of the third portion 153 of the seed layer may have a direct impact on the reliability of the via shown in FIG. 1 when the seed layer is formed in a high aspect ratio via.

In a high aspect ratio via such as a via having an AR value greater than 1.6, a conventional seed layer (not shown) may not provide good adhesion for subsequently formed copper (e.g., via filling materials such as copper). In particular, in the conventional seed layer formed by a PVD process, the third portion 153 (a.k.a. the bottom corner of the seed layer) is thinner than the second portion 152. Such a thinner bottom corner of the seed layer may cause poor adhesion between the barrier layer (not shown) and the subsequently formed copper material (not shown) in the via. Such poor adhesion may cause an open via during reliability tests.

In contrast, as shown in FIG. 1, the bottom corner portion (e.g., the third portion 153) of the seed layer is thicker than the upper portion of the seed layer (e.g., the second portion 152). In particular, at a height of h, the thickness of the seed layer is defined as T2. In accordance with various embodiments, h is about 10% of the depth of the via. The thickness of the second portion 152 is defined as T1.

In order to have good adhesion between the barrier layer and the subsequently formed conductive material in the via, T2 is greater than T1. In accordance with various embodiments, T2 is greater than about 80 Angstroms when AR is around 1.6. In addition, T2 is greater than about 180 Angstroms when AR is around 2.0. The detailed formation process of the third portion 153 of the seed layer shown in FIG. 1 will be described below with respect to FIGS. 2-11.

In sum, in a conventional seed layer, during thermal tests, a thin seed layer, especially a thin bottom corner may not provide strong adhesion between the barrier layer and the subsequently formed copper. Some reliability issues such as copper pullback may occur due to thermal stress. As a result, an open circuit failure may occur due to a disconnection between the subsequently formed copper and the barrier layer.

One advantageous feature of having the thicker bottom corner shown in FIG. 1 is that the thicker bottom corner (e.g., the third portion 153) helps to improve adhesion between the subsequently formed copper and the barrier layer. The improved adhesion prevents the subsequently formed copper from being pulled back and helps to achieve a reliable connection between the subsequently formed copper and the barrier layer. In accordance with various embodiments, after a humidity thermal stress test, the open via failure rate due to the copper pullback issue may be improved from about 70% (the conventional seed layer) to about 0% (the seed layer shown in FIG. 1).

Figure 2:
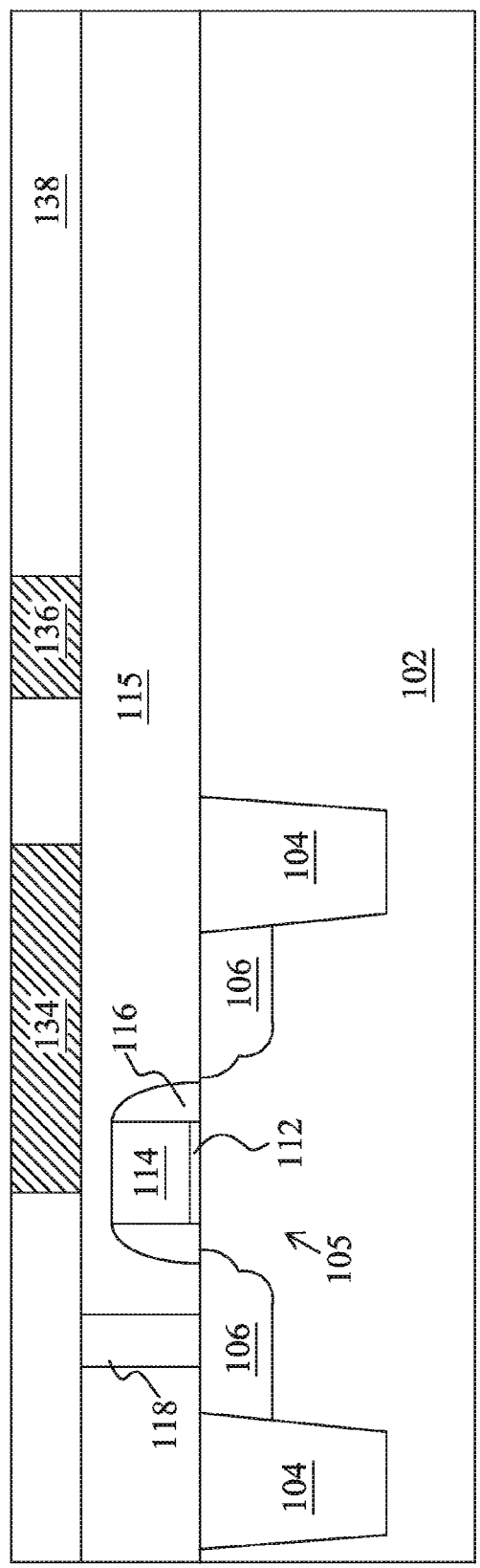
FIG. 2 illustrates a semiconductor device after a variety of electrical circuits have been formed in the substrate in accordance with various embodiments.

FIGS. 2 to 11 illustrate intermediate steps of fabricating the semiconductor device shown in FIG. 1 in accordance with various embodiments. FIG. 2 illustrates a semiconductor device after a variety of electrical circuits have been formed in the substrate in accordance with various embodiments. The substrate 102 may be formed of silicon, although it may also be formed of other group III, group IV, and/or group V elements, such as silicon, germanium, gallium, arsenic, and combinations thereof.

The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like.

As shown in FIG. 2, a metal oxide semiconductor (MOS) transistor 105 and its associated contact plug 118 are used to represent the electrical circuits of the semiconductor device. The MOS transistor 105 is formed in the substrate 102. The MOS transistor 105 includes two drain/source regions 106. As shown in FIG. 2, the drain/source regions 106 are formed on opposite sides of a gate stack. The gate stack includes a gate dielectric layer 112 formed over the substrate 102, a gate electrode formed over the gate dielectric layer 112 and gate spacers 116. As shown in FIG. 2, there may be two isolation regions 104 formed on opposite sides of the MOS transistor 105.

The isolation regions 104 may be shallow trench isolation (STI) regions, and may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a CMP process may be applied to the top surface so that the excess dielectric material may be removed as a result.

The gate dielectric 112 may be a dielectric material such as silicon oxide, silicon oxynitride, silicon nitride, an oxide, a nitrogen-containing oxide, a combination thereof and/or the like. The gate dielectric 112 may have a relative permittivity value greater than about 4. Other examples of such materials include aluminum oxide, lanthanum oxide, hafnium oxide, zirconium oxide, hafnium oxynitride, combinations thereof and/or the like. In some embodiments in which the gate dielectric 112 comprises an oxide layer, the gate dielectrics 112 may be formed by a PECVD process using tetraethoxysilane (TEOS) and oxygen as a precursor. In accordance with various embodiments, the gate dielectric 112 may be of a thickness in a range from about 8 Å to about 200 Å.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In some embodiments in which the gate electrode 114 is poly-silicon, the gate electrode 114 may be formed by depositing doped or undoped poly-silicon by low-pressure chemical vapor deposition (LPCVD) to a thickness in the range of about 400 Å to about 2,400 Å.

The spacers 116 may be formed by blanket depositing one or more spacer layers (not shown) over the gate electrode 114 and the substrate 102. The spacer layers 116 may comprise suitable dielectric materials such as SiN, oxynitride, SiC, SiON, oxide and/or the like. The spacer layers 116 may be formed by commonly used techniques such as CVD, PECVD, sputter and/or the like.

The drain/source regions 106 may be formed in the substrate 102 on opposing sides of the gate dielectric 112. In some embodiments in which the substrate 102 is an n-type substrate, the drain/source regions 106 may be formed by implanting appropriate p-type dopants such as boron, gallium, indium and/or the like. Alternatively, in some embodiments in which the substrate 102 is a p-type substrate, the drain/source regions 106 may be formed by implanting appropriate n-type dopants such as phosphorous, arsenic and/or the like.

An interlayer dielectric layer 115 is formed on top of the substrate 102. The interlayer dielectric layer 115 may be formed, for example, of a low-K dielectric material, such as silicon oxide. The interlayer dielectric layer 115 may be formed by any suitable method known in the art, such as spinning, chemical vapor deposition (CVD) and plasma enhanced chemical vapor deposition (PECVD). It should also be noted that one skilled in the art will recognize while FIG. 2 illustrates a single interlayer dielectric layer, the interlayer dielectric layer 115 may comprise a plurality of dielectric layers.

As shown in FIG. 2, the interlayer dielectric layer 115 is formed over the substrate 102. There may be a contact plug 118 formed in the interlayer dielectric layer 115. The contact plug 118 is formed through the interlayer dielectric layer 115 to provide an electrical connection between the MOS transistor 105 and interconnect structures (not shown) formed over the interlayer dielectric layer 115.

The contact plug 118 may be formed by using photolithography techniques to deposit and pattern a photoresist material on the interlayer dielectric layer 115. A portion of the photoresist is exposed according to the location and shape of the contact plug 118. An etching process, such as an anisotropic dry etch process, may be used to create an opening in the interlayer dielectric layer 115.

A conductive liner may be deposited prior to filling the contact plug hole. The conductive liner is preferably conformal, and may comprise a single layer of Ta, TaN, WN, WSi, TiN, Ru and any combinations thereof. The conductive liner may be typically used as a barrier layer for preventing the conductive material such as copper from diffusing into the underlying substrate 102. The conductive liner may be deposited by using suitable deposition process such as CVD, PVD, Atomic Layer Deposition (ALD) and/or the like.

A conductive material is then filled in the opening. The conductive material may be deposited by using CVD, PVD or ALD. The conductive material is deposited over the conductive liner to fill the contact plug opening. Excess portions of the conductive material are removed from the top surface of the interlayer dielectric layer 115 by using a planarization process such as chemical mechanical planarization (CMP) techniques. The conductive material may be copper, tungsten, aluminum, silver, titanium, titanium nitride, tantalum and combinations thereof and/or the like.

An inter-metal dielectric layer 138 is formed over the interlayer dielectric layer 115. There may be two metal lines 134 and 136 embedded in the inter-metal dielectric layer 138. The inter-metal dielectric layer 138 may be formed of a low-K dielectric material such as fluorosilicate glass (FSG) and/or the like. The inter-metal dielectric layer 138 may be formed by suitable deposition techniques such as PECVD techniques, high-density plasma chemical vapor deposition (HDPCVD) and/or the like.

Figure 3:
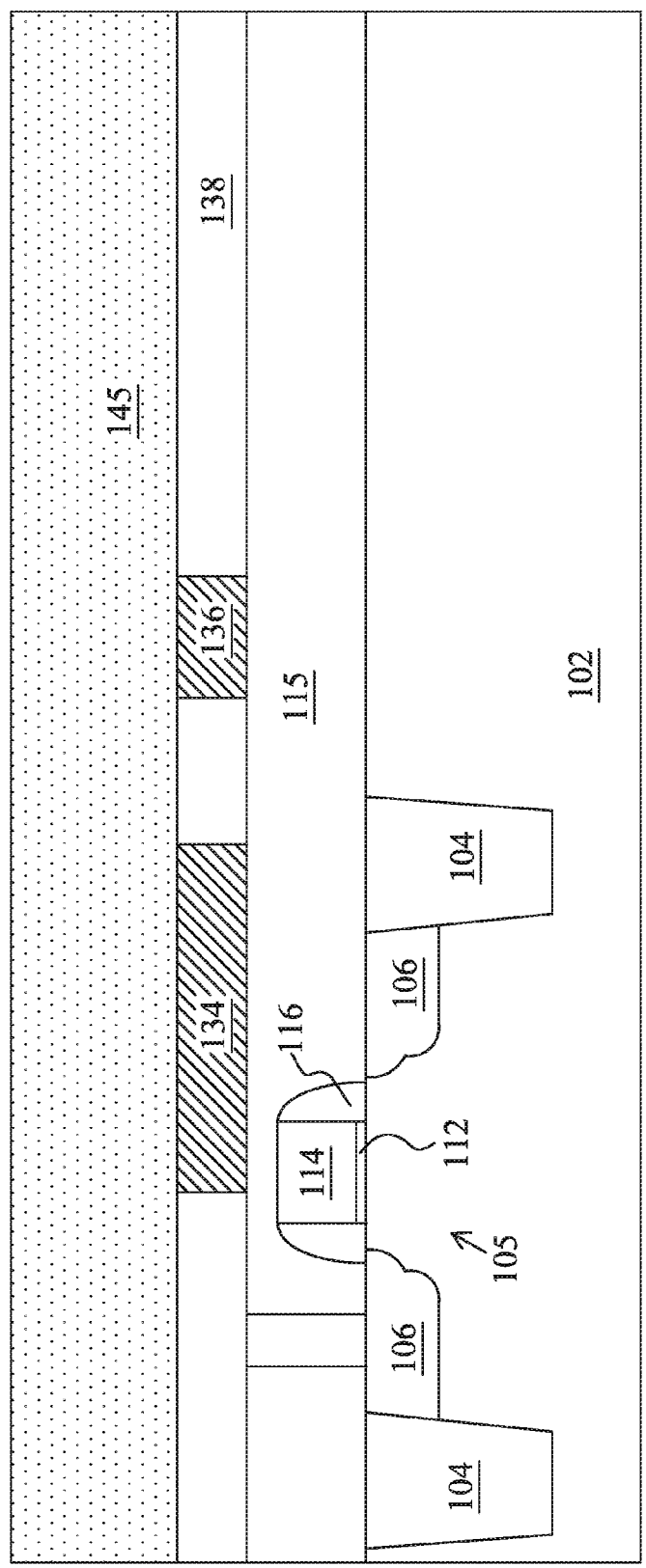
FIG. 3 illustrates a cross sectional view of the semiconductor device shown in FIG. 2 after a first dielectric layer is formed over the substrate in accordance with various embodiments.

FIG. 3 illustrates a cross sectional view of the semiconductor device shown in FIG. 2 after a first dielectric layer is formed over the substrate in accordance with various embodiments. The first dielectric layer 145 may be formed of a low-K dielectric material such as fluorosilicate glass (FSG) and/or the like. The first dielectric layer 145 may function as an inter-metal dielectric layer. The first dielectric layer 145 may be formed by suitable deposition techniques such as PECVD techniques, high-density plasma chemical vapor deposition (HDPCVD) and/or the like.

Figure 4:
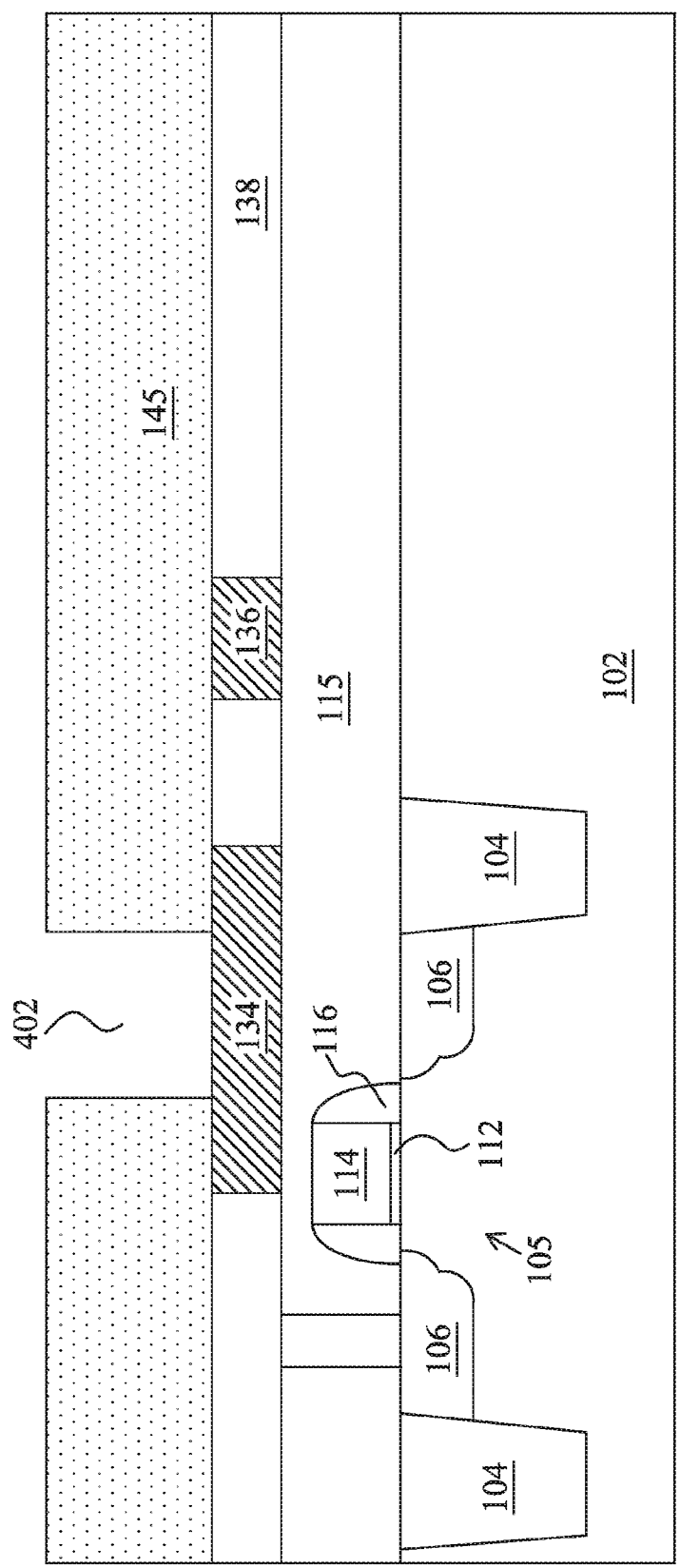
FIG. 4 illustrates a cross sectional view of the semiconductor device shown in FIG. 3 after an opening is formed in the first dielectric layer in accordance with various embodiments.

FIG. 4 illustrates a cross sectional view of the semiconductor device shown in FIG. 3 after an opening is formed in the first dielectric layer in accordance with various embodiments. According to the location of a via formed upon the metal line 134, an opening 402 is formed in the first dielectric layer 145. The opening 402 may be formed by any suitable semiconductor patterning techniques such as an etching process, a laser ablation process and/or the like.

Figure 5:
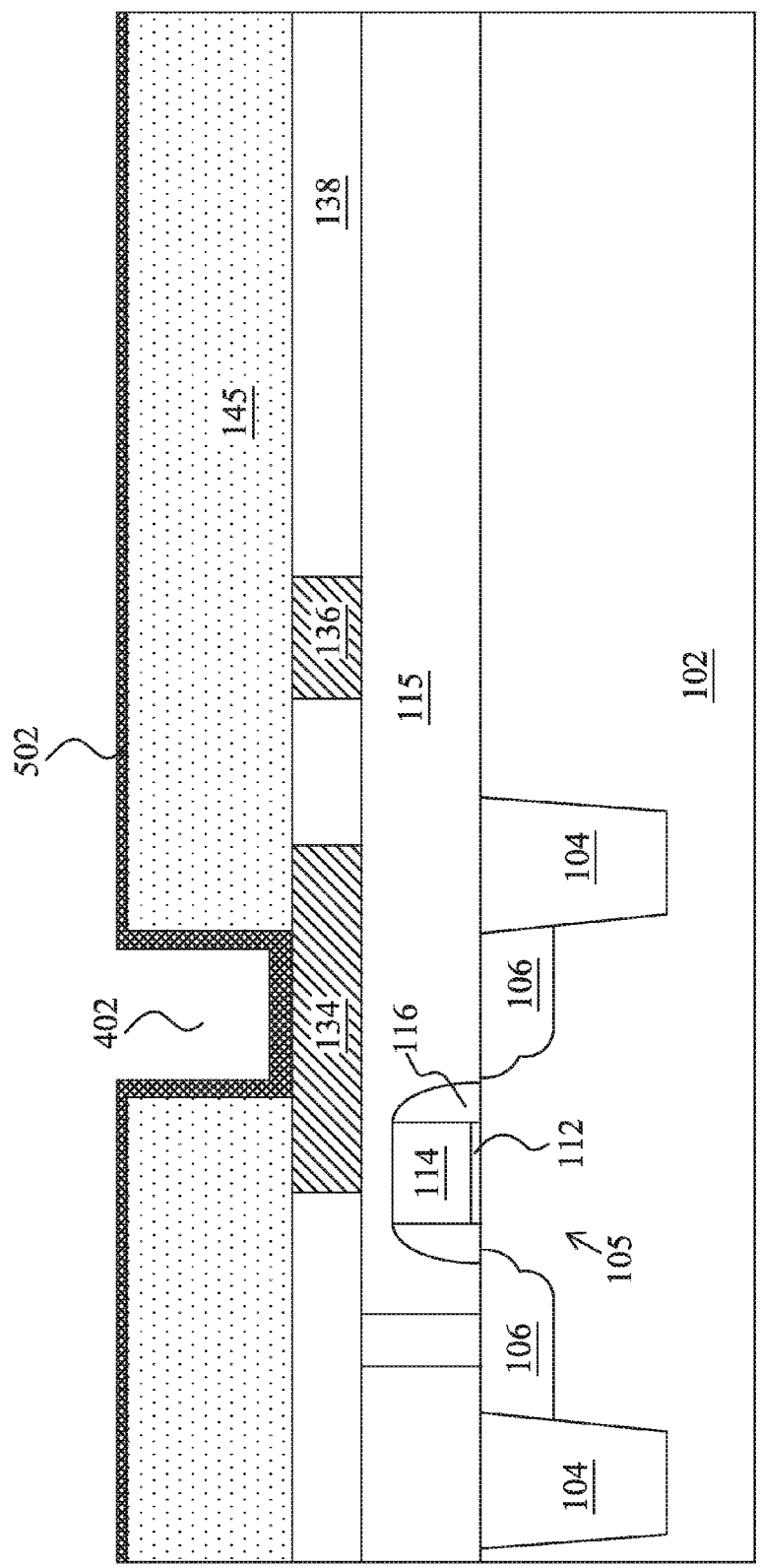
FIG. 5 illustrates a cross sectional view of the semiconductor device shown in FIG. 4 after a barrier layer is formed over the sidewalls and bottom of the opening in accordance with various embodiments.

FIG. 5 illustrates a cross sectional view of the semiconductor device shown in FIG. 4 after a barrier layer is formed over the sidewalls and bottom of the opening in accordance with various embodiments. A barrier layer 502 is formed conformally along the sidewalls and bottom of the opening 402. The barrier layer may be formed of suitable metal materials such as titanium, titanium nitride, tantalum, tantalum nitride, and combinations thereof and/or the like. The barrier layer 502 may be formed using suitable fabrication techniques such as ALD, PECVD, plasma enhanced physical vapor deposition (PEPVD) and/or the like. In accordance with various embodiments, the thickness of the barrier layer 502 may be in a range from about 20 Angstroms to about 200 Angstroms.

Figure 6:
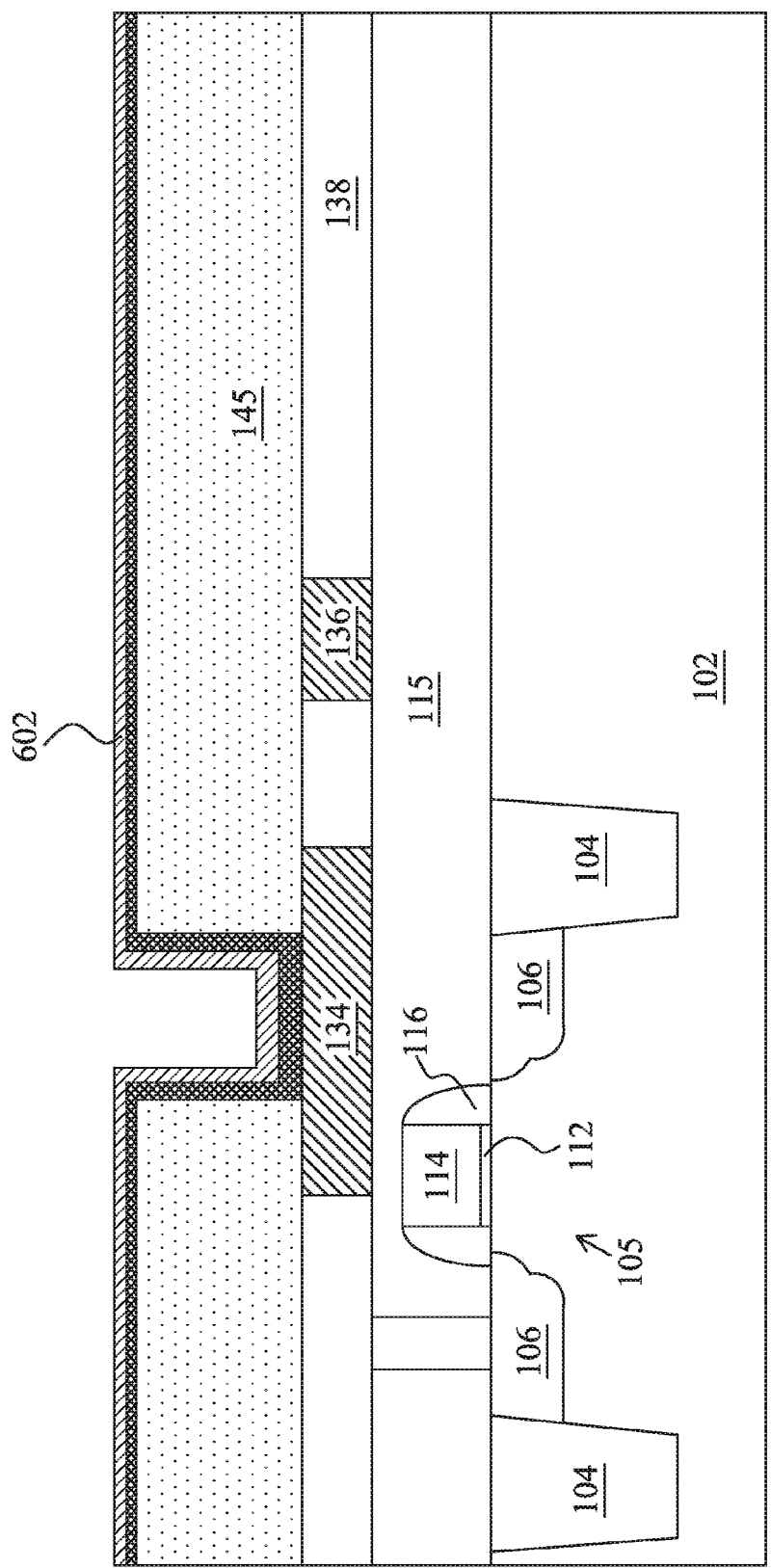
FIG. 6 illustrates a cross sectional view of the semiconductor device shown in FIG. 5 after a seed layer is formed over the barrier layer in accordance with various embodiments.

FIG. 6 illustrates a cross sectional view of the semiconductor device shown in FIG. 5 after a seed layer is formed over the barrier layer in accordance with various embodiments. The seed layer 602 may be may be formed of copper, nickel, gold, any combination thereof and/or the like. The seed layer may be formed by suitable deposition techniques such as PVD, CVD and/or the like. The seed layer may have a thickness in a range from about 50 Angstroms to about 1,000 Angstroms.

In addition, the seed layer 602 may be alloyed with a material that improves the adhesive properties of the seed layer 602 so that it can act as an adhesion layer. For example, the seed layer 602 may be alloyed with a material such as manganese or aluminum, which will migrate to the interface between the seed layer and the barrier layer and will enhance the adhesion between these two layers. The alloying material may be introduced during formation of the seed layer 602. The alloying material may comprise no more than about 10% of the seed layer 602. It should be noted that, due to the thicker bottom corner shown in FIG. 1, the alloy process may be an optional step because the thicker bottom corner may help to improve the adhesion between the barrier layer and the seed layer.

Figure 7:
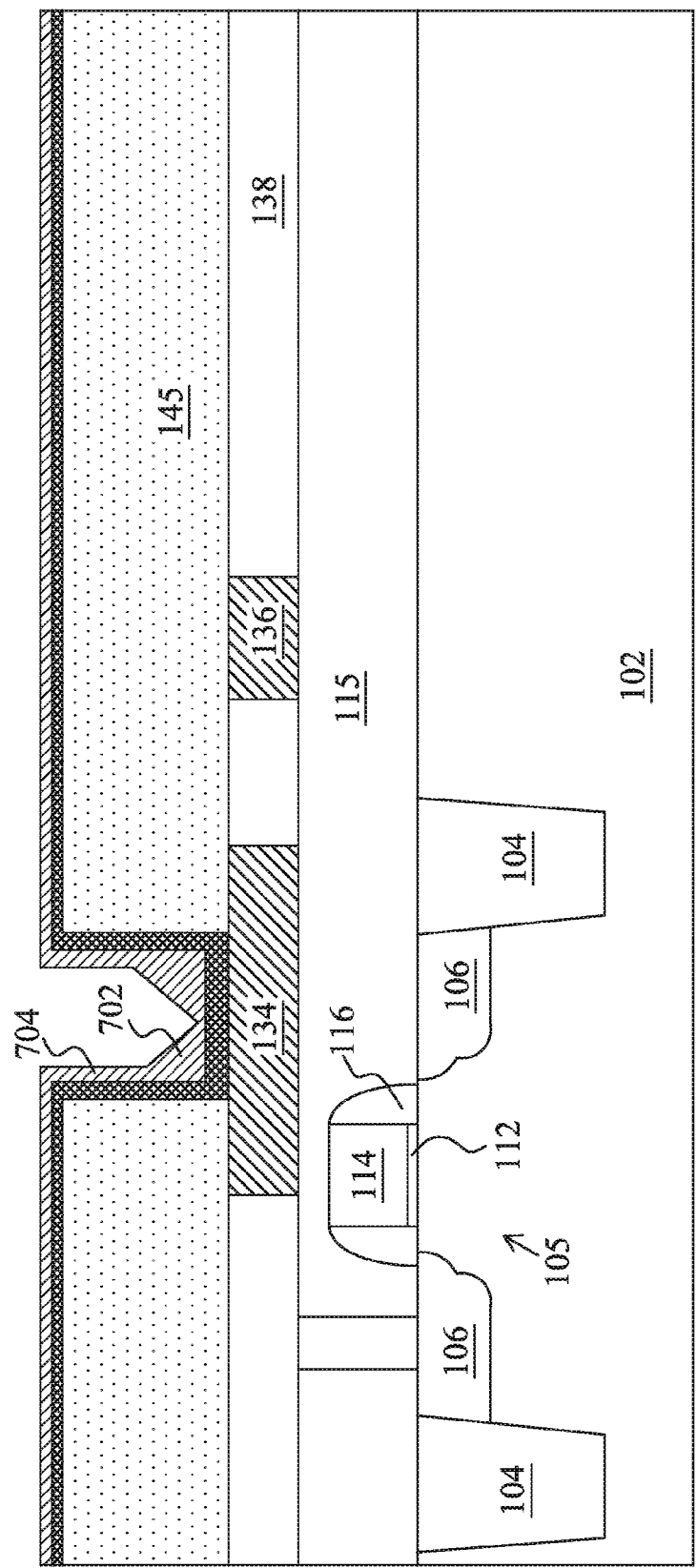
FIG. 7 illustrates a cross sectional view of the semiconductor device shown in FIG. 6 after a re-sputtering process is performed on the seed layer in accordance with various embodiments.

FIG. 7 illustrates a cross sectional view of the semiconductor device shown in FIG. 6 after a re-sputtering process is performed on the seed layer in accordance with various embodiments. The re-sputtering process may be implemented by using an argon plasma beam. In particular, the argon plasma beam is targeted on the bottom of the seed layer 602. By controlling the bias voltage of the plasma of the re-sputtering process, argon ions strike the bottom of the seed layer 602. The copper ions of the bottom portion of the seed layer 602 may achieve significant momentum due to collisions with argon ions. As a result, the energetic copper ions may overcome the binding force of the crystal surface of the seed layer 602. Furthermore, the copper ions are splashed toward the sidewalls of the seed layer 602, especially the bottom corner 702 of the sidewall. As a result, the thickness of the bottom corner 702 increases in comparison with the upper portion 704 of the sidewall.

Figure 8:
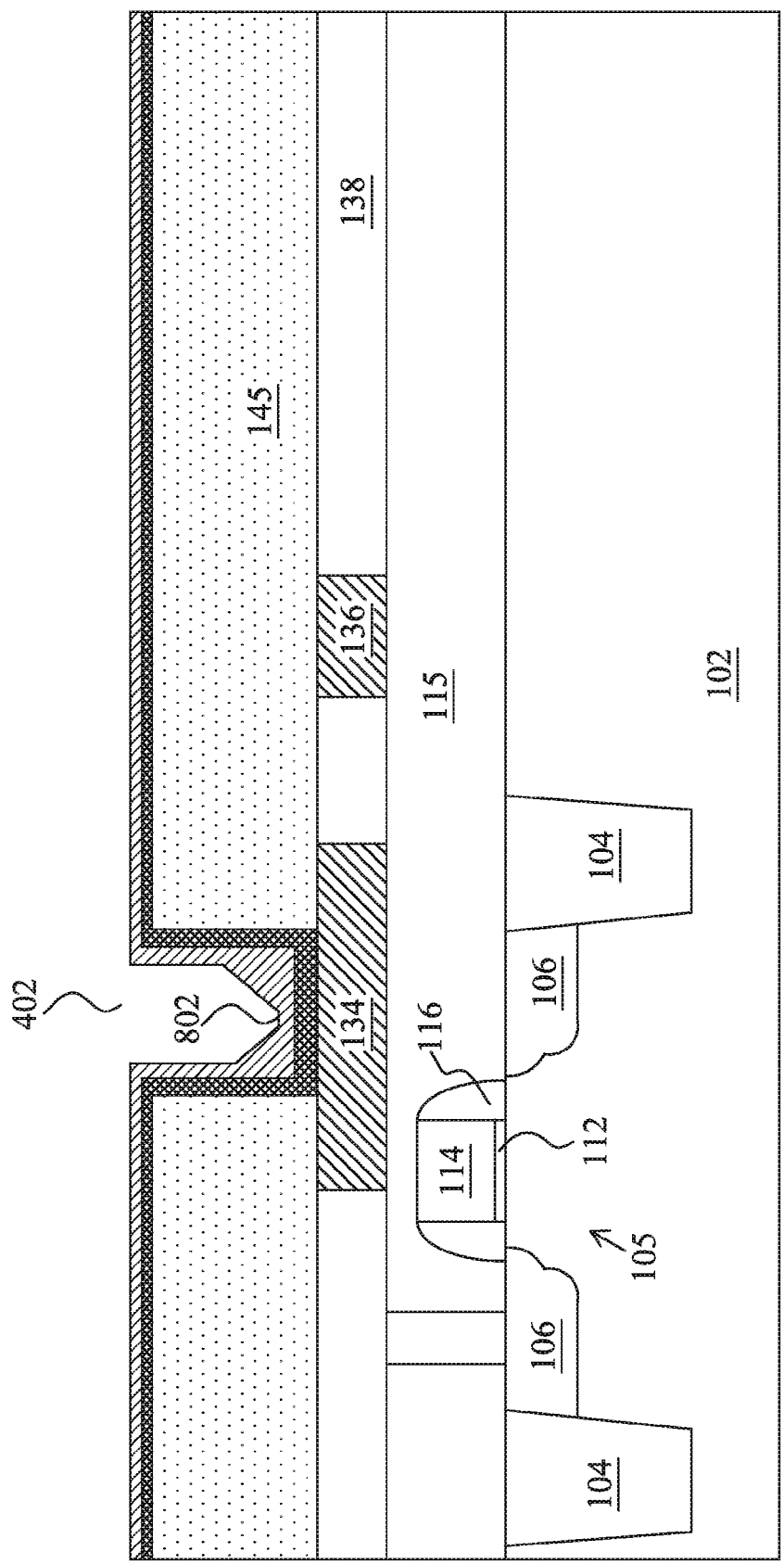
FIG. 8 illustrates a cross sectional view of the semiconductor device shown in FIG. 7 after a physical vapor deposition (PVD) process is performed on the bottom of the seed layer in accordance with various embodiments.

FIG. 8 illustrates a cross sectional view of the semiconductor device shown in FIG. 7 after a PVD process is performed on the bottom of the seed layer in accordance with various embodiments. After the re-sputtering process shown in FIG. 7, the thickness of the bottom of the seed layer becomes thinner in comparison with a bottom of a seed layer formed by a PVD process. The PVD process may be performed on the bottom 802 of the seed layer so that the thickness of the bottom 802 of the seed layer may increase to a level equal to a thickness generated by a normal PVD process.

Figure 9:
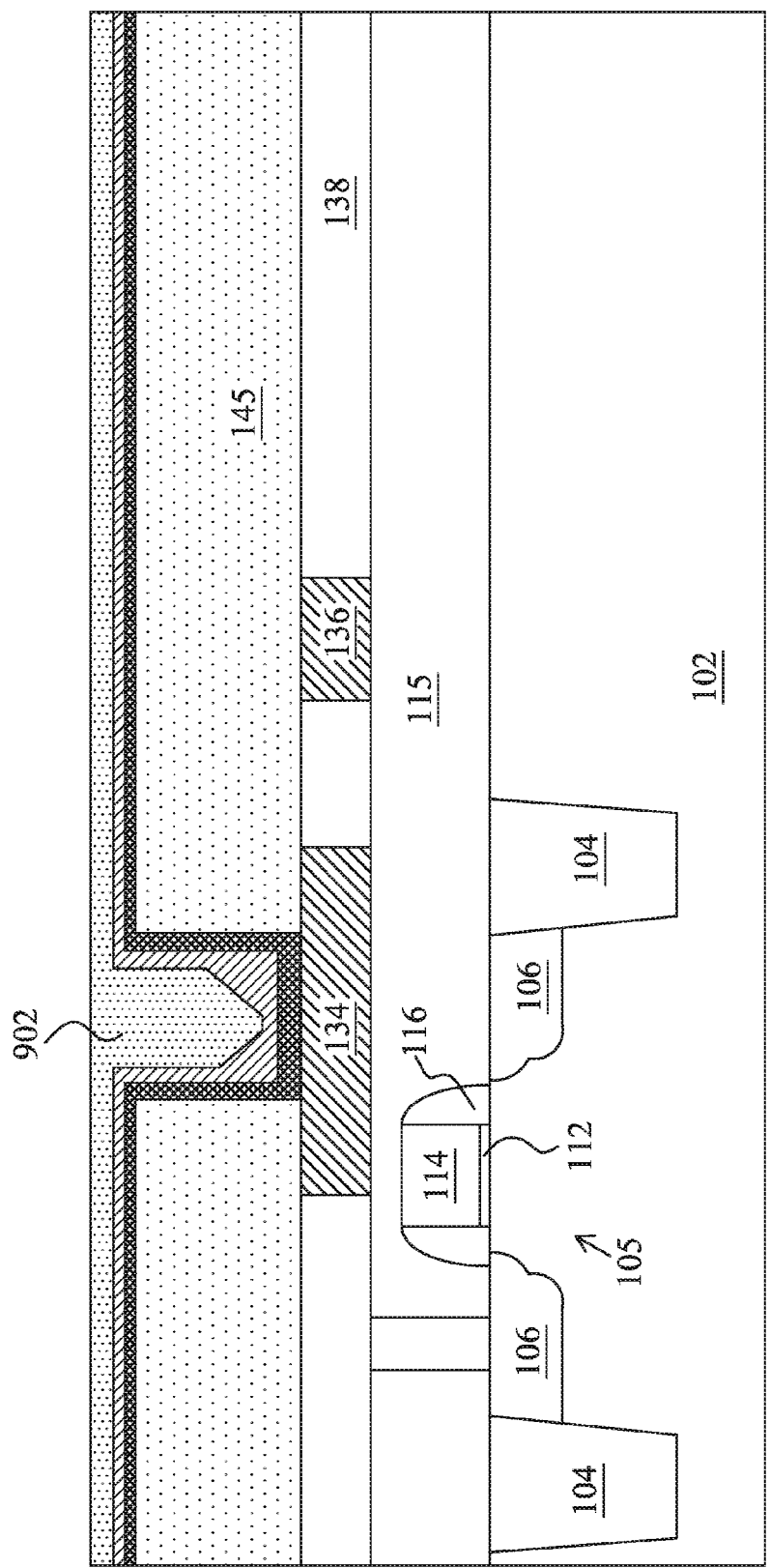
FIG. 9 illustrates a cross sectional view of the semiconductor device shown in FIG. 8 after a conductive material is filled in the opening in accordance with various embodiments.

FIG. 9 illustrates a cross sectional view of the semiconductor device shown in FIG. 8 after a conductive material is filled in the opening in accordance with various embodiments. As shown in FIG. 9, a conductive material 902 may be filled in the opening (e.g., opening 402 shown in FIG. 8) to form a via coupled to the metal line 134. The conductive material 902 may be copper, but can be any suitable conductive materials, such as copper alloys, aluminum, tungsten, silver, any combinations thereof and/or the like. The conductive material 902 may be formed by suitable techniques such as an electro-less plating process, CVD, electroplating and/or the like.

Figure 10:
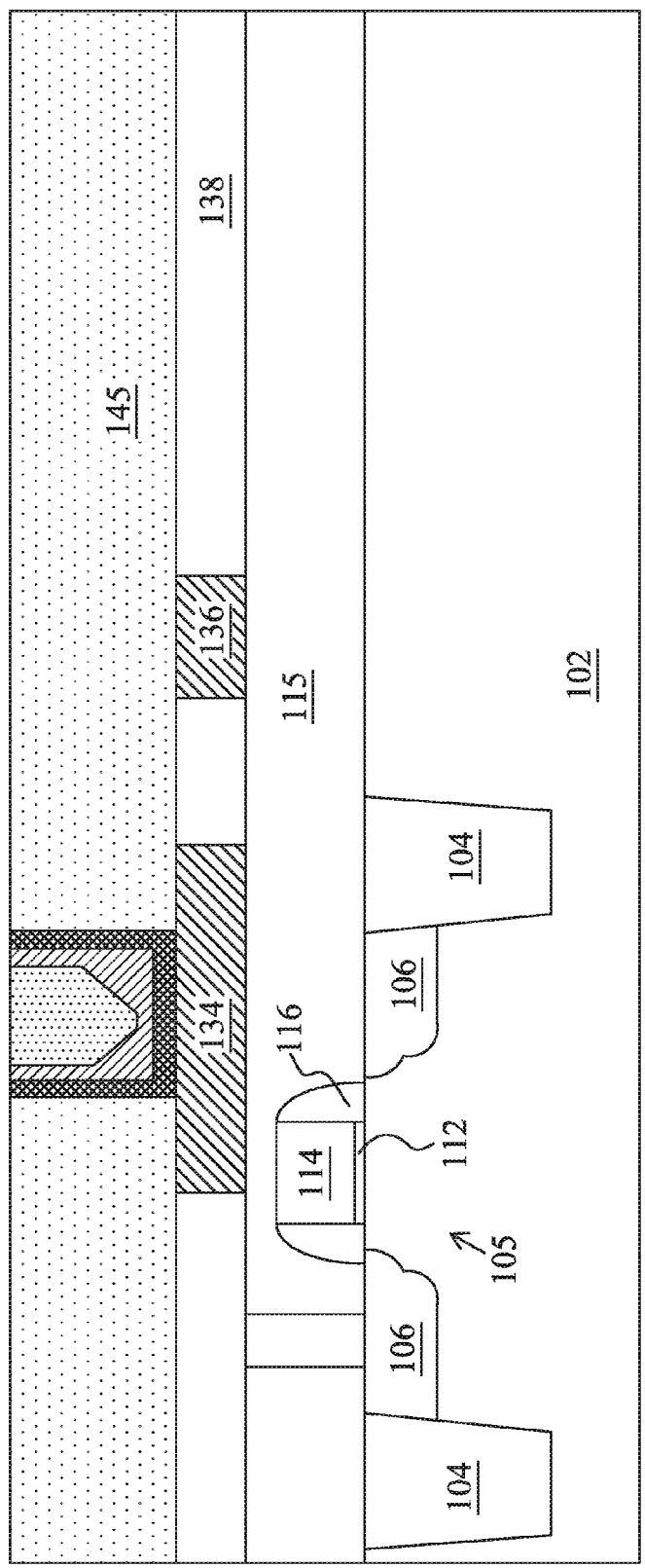
FIG. 10 illustrates a cross sectional view of the semiconductor device shown in FIG. 9 after a planarization process is performed to remove excess conductive materials in accordance with various embodiments.

FIG. 10 illustrates a cross sectional view of the semiconductor device shown in FIG. 9 after a planarization process is performed to remove excess conductive materials in accordance with various embodiments. The planarization process may be implemented by using suitable techniques such as grinding, polishing and/or chemical etching, a combination of etching and grinding techniques. In accordance with various embodiments, the planarization process may be implemented by using a CMP process. In the CMP process, a combination of etching materials and abrading materials are put into contact with the top surface of the semiconductor device and a grinding pad (not shown) is used to grind away excess copper and portions of the barrier layer and the seed layer until the first dielectric layer 145 is exposed.

Figure 11:
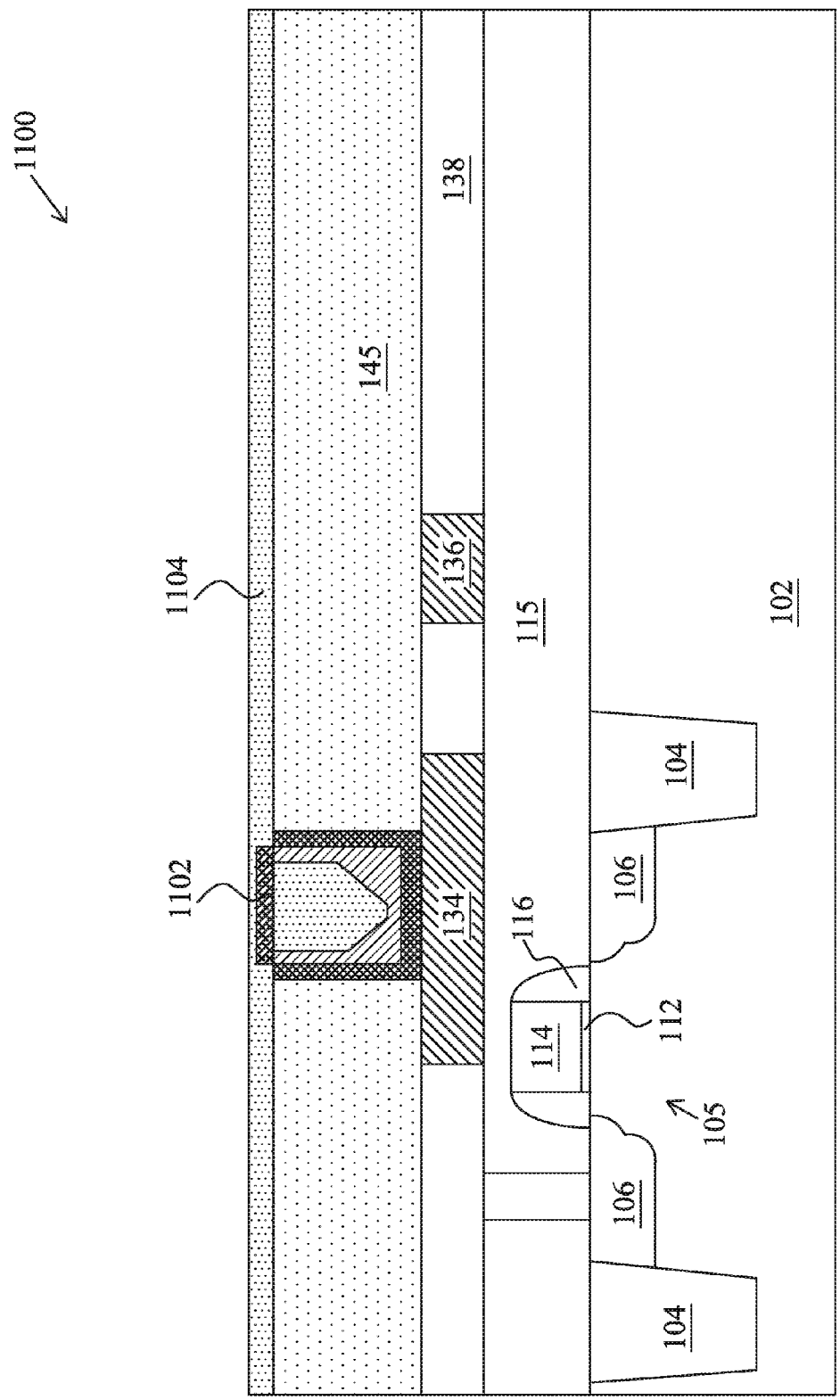
FIG. 11 illustrates a cross sectional view of the semiconductor device shown in FIG. 10 after a metal cap and an etch stop layer have been formed over the via in accordance with various embodiments.

FIG. 11 illustrates a cross sectional view of the semiconductor device shown in FIG. 10 after a metal cap and an etch stop layer have been formed over the via in accordance with various embodiments. The conductive material of the via such as copper shows poor adhesion to an overlying dielectric capping layer. In order to improve the poor adhesion between the copper of the via and an overlying dielectric layer, a metal cap layer 1102 is formed between the copper of the via and the overlying dielectric layer. The metal cap layer 1102 may be a cobalt/tungsten/phosphorus (CoWP) metal cap. The CoWP metal cap layer 1102 can be formed by using suitable semiconductor deposition techniques such as electroless deposition techniques and the like.

The etch stop layer 1104 is formed of a dielectric material having a different etch selectivity from adjacent layers. In some embodiments, the etch stop layer 1104 may be formed of SiN, SiCN, SiCO, CN, combinations thereof and/or the like. The etch stop layer 1104 may be deposited by suitable deposition techniques such as CVD and the like.

Figure 12:
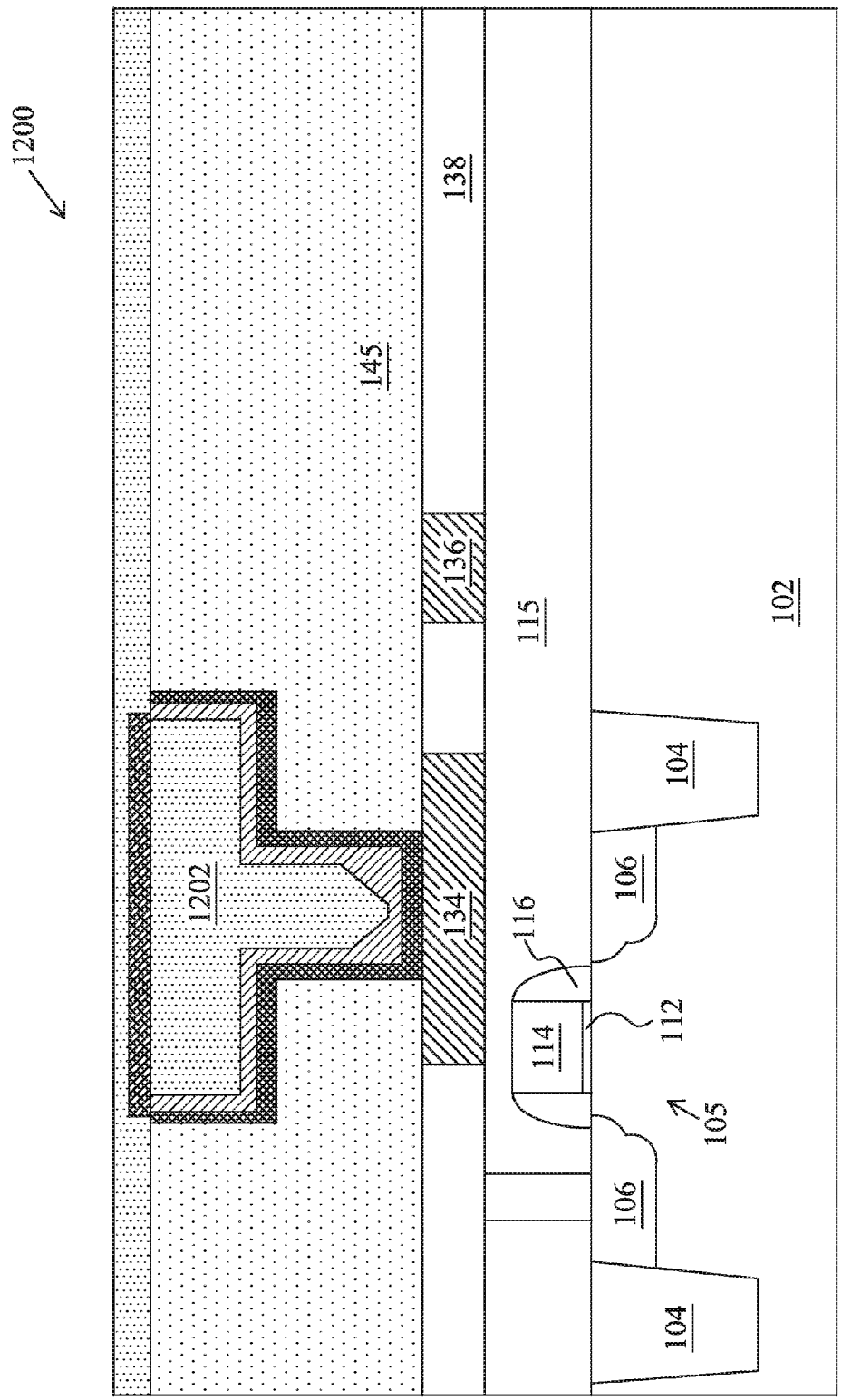
FIG. 12 illustrates a cross sectional view of another semiconductor device having the seed layer structure shown in FIG. 1 in accordance with various embodiments.

FIG. 12 illustrates a cross sectional view of another semiconductor device having the seed layer structure shown in FIG. 1 in accordance with various embodiments. The structure of the semiconductor device 1200 is similar to the structure of the semiconductor device 1100 shown in FIG. 11 except that the via is formed by a dual damascene process. In the dual damascene structure 1202 shown in FIG. 12, the via portion may be of the same seed layer as the via formed by a single damascene process shown in FIG. 11.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    depositing a dielectric layer over a substrate;
    forming a dual damascene opening in the dielectric layer, wherein the dual damascene opening comprises:
        a via opening; and
        a trench opening;
    depositing a seed layer over a surface of the dual damascene opening;
    applying a re-sputtering process to a bottom portion of the seed layer, wherein ions of the bottom portion of the seed layer are splashed toward a sidewall portion of the seed layer, and wherein a lower portion of the sidewall portion is thicker than the bottom portion; and
    performing a deposition process on the bottom portion of the seed layer.

2. The method of claim 1, further comprising:
    before the step of depositing a seed layer over a surface of the dual damascene opening, forming a barrier layer along sidewalls and a bottom of the dual damascene opening.

3. The method of claim 1, further comprising:
    depositing the seed layer using a physical vapor deposition process.

4. The method of claim 1, the step of applying the re-sputtering process to the bottom portion of the seed layer further comprising:
    striking the bottom portion of the seed layer using an argon plasma beam.

5. The method of claim 1, further comprising:
filling the dual damascene opening with copper.

6. The method of claim 5, further comprising:
applying a planarization process to remove excess copper.

7. The method of claim 1, wherein the seed layer comprises:
- a sidewall seed layer portion formed along a sidewall of the via opening and close to an upper portion of the sidewall of the via opening, wherein the sidewall seed layer portion is of a first thickness; and
- a corner seed layer portion formed between the bottom of the via opening and the sidewall seed layer portion, wherein the corner seed layer portion is of a second thickness, and wherein the second thickness is greater than the first thickness.

8. A method comprising:
depositing a first dielectric layer over a substrate;
forming a via opening in the first dielectric layer;
depositing a seed layer along sidewalls and a bottom of the via opening;
performing a re-sputtering process on a bottom of the seed layer, wherein ions of the bottom of the seed layer are splashed toward a sidewall portion of the seed layer, and wherein a lower portion of the sidewall portion of the seed layer is thicker than the bottom of the seed layer;
applying a deposition process to the bottom of the seed layer; and
filling the via opening with a conductive material.

9. The method of claim 8, further comprising:
applying a planarization process to remove the conductive material over a top surface of the first dielectric layer.

10. The method of claim 9, further comprising:
forming a metal cap over the conductive material; and
depositing an etch stop layer over the metal cap.

11. The method of claim 8, wherein:
the conductive material is copper.

12. The method of claim 8, further comprising:
before the step of depositing the seed layer along the sidewalls and the bottom of the via opening, depositing a barrier layer along the sidewalls and the bottom of the via opening.

13. The method of claim 8, wherein:
the re-sputtering process is implemented by using an argon plasma beam striking the bottom of the seed layer.

* * * * *

UNITED STATES PATENT AND TRADEMARK OFFICE
CERTIFICATE OF CORRECTION

PATENT NO. : 8,778,801 B2
APPLICATION NO. : 13/624664
DATED : July 15, 2014
INVENTOR(S) : Chen-Bin Chiang et al.

Page 1 of 1

It is certified that error appears in the above-identified patent and that said Letters Patent is hereby corrected as shown below:

In the Claims

In Col. 9, line 7, claim 7, delete "along a side wall" and insert --along a sidewall--.

Signed and Sealed this
Seventh Day of October, 2014

Michelle K. Lee
*Deputy Director of the United States Patent and Trademark Office*